United States Patent
Lee

(10) Patent No.: US 7,052,940 B2
(45) Date of Patent: May 30, 2006

(54) METHOD OF FABRICATING TOP GATE TYPE THIN FILM TRANSISTOR HAVING LOW TEMPERATURE POLYSILICON

(75) Inventor: Seok-Woo Lee, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/648,401

(22) Filed: Aug. 27, 2003

(65) Prior Publication Data
US 2004/0043547 A1    Mar. 4, 2004

(30) Foreign Application Priority Data
Sep. 4, 2002    (KR)    ...................... 10-2002-0053086

(51) Int. Cl.
    *H01L 21/00*    (2006.01)
(52) U.S. Cl. ...................... 438/149; 438/151; 438/166; 438/758; 438/778; 438/787
(58) Field of Classification Search .................. 438/96, 438/97, 149–151, 166, 299, 308, 364, 378, 438/479, 482, 486–488, 491, 585, 694, 710, 438/795, 913, 758, 778, 787
See application file for complete search history.

(56) References Cited

U.S. PATENT DOCUMENTS

| | | | | |
|---|---|---|---|---|
| 5,371,383 A * | 12/1994 | Miyata et al. | ................. | 257/77 |
| 5,510,146 A * | 4/1996 | Miyasaka | .................... | 438/151 |
| 5,811,323 A * | 9/1998 | Miyasaka et al. | ........... | 438/151 |
| 5,817,549 A * | 10/1998 | Yamazaki et al. | .......... | 438/166 |
| 5,840,600 A * | 11/1998 | Yamazaki et al. | .......... | 438/151 |
| 6,017,779 A * | 1/2000 | Miyasaka | ................... | 438/149 |
| 6,071,796 A * | 6/2000 | Voutsas | ....................... | 438/487 |
| 6,077,730 A * | 6/2000 | Lee et al. | .................... | 438/149 |
| 6,077,758 A * | 6/2000 | Zhang et al. | ............... | 438/486 |
| 6,168,980 B1 * | 1/2001 | Yamazaki et al. | .......... | 438/162 |
| 6,211,098 B1 * | 4/2001 | Twu et al. | ................... | 438/787 |
| 6,246,095 B1 * | 6/2001 | Brady et al. | ................ | 257/411 |
| 6,261,934 B1 * | 7/2001 | Kraft et al. | ................. | 438/592 |
| 6,268,631 B1 * | 7/2001 | Fukada et al. | .............. | 257/347 |
| 6,294,219 B1 * | 9/2001 | Tsai et al. | ................... | 427/314 |
| 6,326,258 B1 * | 12/2001 | Iizuka | ........................ | 438/239 |

(Continued)

FOREIGN PATENT DOCUMENTS

JP    10223913 A  *  8/1998

(Continued)

OTHER PUBLICATIONS

Stanley Wolf and Richard N. Tauber, Silicon Processing For The VLSI Era, Second Edition, pp. 180-181.*

(Continued)

*Primary Examiner*—Michael Lebentritt
*Assistant Examiner*—Stanetta Isaac
(74) *Attorney, Agent, or Firm*—McKenna, Long & Aldridge, LLP.

(57) ABSTRACT

A method of forming a polysilicon thin film transistor that includes depositing an amorphous silicon layer over a substrate, crystallizing the amorphous silicon layer into a polycrystalline silicon layer, patterning the polycrystalline silicon layer to form a polysilicon active layer for a thin film transistor, depositing silicon oxide over the polysilicon active layer to form a gate insulation layer under a vacuum condition, applying heat to anneal the gate insulation layer under a vacuum condition and forming a gate electrode on the annealed gate insulation layer.

22 Claims, 9 Drawing Sheets

U.S. PATENT DOCUMENTS

| | | | |
|---|---|---|---|
| 6,335,232 B1* | 1/2002 | Ohori et al. | 438/158 |
| 6,335,542 B1* | 1/2002 | Miyasaka | 257/66 |
| 6,436,848 B1* | 8/2002 | Ramkumar | 438/777 |
| 6,444,506 B1* | 9/2002 | Kusumoto et al. | 438/151 |
| 6,444,507 B1* | 9/2002 | Miyasaka | 438/164 |
| 6,458,715 B1* | 10/2002 | Sano et al. | 438/773 |
| 6,482,752 B1* | 11/2002 | Yamazaki et al. | 438/758 |
| 6,534,744 B1* | 3/2003 | Yamazaki et al. | 219/121.8 |
| 6,569,720 B1* | 5/2003 | Kunii | 438/151 |
| 6,610,374 B1* | 8/2003 | Tsai et al. | 427/554 |
| 6,624,468 B1* | 9/2003 | Takebuchi | 257/321 |
| 6,632,711 B1* | 10/2003 | Sugano et al. | 438/151 |
| 6,642,091 B1* | 11/2003 | Tanabe | 438/166 |
| 6,657,154 B1* | 12/2003 | Tanabe et al. | 219/121.6 |
| 6,673,126 B1* | 1/2004 | Miyasaka | 29/25.01 |
| 6,682,960 B1* | 1/2004 | Mochizuki | 438/149 |
| 6,730,368 B1* | 5/2004 | Kawamura | 427/554 |
| 6,815,240 B1* | 11/2004 | Hayashi | 438/30 |
| 6,919,235 B1* | 7/2005 | Yamazaki et al. | 438/149 |
| 6,933,180 B1* | 8/2005 | Tanaka et al. | 438/149 |

FOREIGN PATENT DOCUMENTS

| | | |
|---|---|---|
| JP | 2002-208707 | 7/2002 |
| KR | 1996-0009053 | 3/1996 |
| KR | 0154765 B1 | 7/1998 |
| KR | 1999-0058635 | 7/1999 |

OTHER PUBLICATIONS

Stanley Wolf and Richard N. Tauber, Silicon Processing For the VLSI Era, vol. I, pp. 169 and 171-172.*

Stanley Wolf, Silicon Processing For The VLSI Era, 1986, Lattice Press, vol. II, p. 436.*

* cited by examiner

METHOD OF FABRICATING TOP GATE TYPE THIN FILM TRANSISTOR HAVING LOW TEMPERATURE POLYSILICON

This application claims the benefit of Korean Application No. 2002-53086, filed on Sep. 4, 2002 in Korea, which is hereby incorporated by reference.

BACKGROUND OF THE INVENTION

1. Field of the Invention

The present invention relates to a thin film transistor for use in a liquid crystal display device, and more particularly, to a method of fabricating a top gate type thin film transistor (TFT) having low temperature polysilicon.

2. Discussion of the Related Art

In general, silicon is classified into amorphous silicon and crystalline silicon depending on the silicon's crystalline state. It is possible for the amorphous silicon to be formed as a thin film on a glass substrate. Because the glass substrate has a low melting point, the amorphous silicon is deposited at a low temperature on the glass substrate. The amorphous silicon is generally used for a switching device, such as a thin film transistor in pixel of a liquid crystal display panel. However, a thin film of amorphous silicon has some disadvantages, such as decreased reliability, decreased electrical characteristics when used in a switching device, and is difficult to redundantly form in each pixel of a very large area liquid crystal display panel.

A liquid crystal display panel can be utilized for a laptop computer, a wall-mounted TV or other commercial applications. However, since these commercial products need a large-sized display, high resolution, and high color image rendering capability, the thin film transistor used as a switching device in each pixel has to have superior electrical characteristics, such as high field effect mobility, reliability against high frequency, and low leakage current. The demand for such superior electrical characteristics has forced thin film transistor producers to research and develop polycrystalline silicon (i.e., polysilicon) for use in the thin film transistor.

Recently, a low temperature polysilicon thin film transistor (LTPS-TFT) has been widely attracting attention for system-on-panel-integration in CMOS process. Such an LTPS-TFT can be used in an active matrix type liquid crystal display device. However, at this time, it is necessary to enhance the quality of a gate insulation layer for the purpose of improving the operating characteristics of the low temperature polysilicon thin film transistor (LTPS-TFT).

FIG. 1 is a cross-sectional view illustrating a low temperature polysilicon thin film transistor (LTPS-TFT) according to the related art. As shown in FIG. 1, the LTPS-TFT has a polysilicon active layer 16 over a substrate 10 and a gate electrode 20 over the polysilicon active layer 16 to make a top gate type thin film transistor. Because the polysilicon active layer 16 is formed by applying heat to amorphous silicon, the gate electrode 20 is formed in a later step after the step of forming the polysilicon layer 16 to protect the gate electrode 20 from the applied heat. More specifically, since the metal of the gate electrode 20 may be affected by the applied heat, the polysilicon layer 16 is formed and then the gate electrode 20 is formed over the polysilicon active layer 16 thereafter. Between the active layer 16 and the gate electrode 20, a silicon oxide 18 (often referred to as a gate insulation layer) is formed. The polysilicon active layer 16 is divided into an active portion 16a in the middle and highly-doped source/drain portions 16b on left and right sides. The gate electrode 20 is formed to correspond in position to the active portion 16a. Source and drain electrodes 28 and 30 are formed over the substrate 10 to contact the highly-doped source/drain portions 16b, respectively.

The polysilicon may be used for a bottom gate type thin film transistor. The bottom gate type thin film transistor usually has a gate electrode on a substrate, a gate insulation layer on the gate electrode, and an amorphous silicon layer on the gate insulation layer especially over the gate electrode. The amorphous silicon layer is then crystallized through the laser crystallization to be the polysilicon layer. At this time, however, there are some disadvantages, i.e., the step of the gate electrode causes the nonuniformity of the polysilicon. Therefore, the bottom gate type thin film transistor having such polysilicon represents bad electrical characteristics so that the polysilicon layer is hardly used for the bottom gate type thin film transistor.

FIGS. 2A to 2E are cross-sectional views illustrating process steps of forming a low temperature polysilicon thin film transistor (LTPS-TFT) having a top gate according to the related art. As shown in FIG. 2A, a buffer layer 12 is first deposited on the substrate 10. The buffer layer 12 is formed of one of silicon nitride and silicon oxide. The buffer layer 12 prevents alkali substances and the like in the substrate 10 from spreading into a silicon layer that is subsequently formed. Thereafter, an amorphous silicon (a-Si:H) layer 14 is sequentially deposited on the buffer layer 12, and then crystallized. There are a lot of methods of crystallizing amorphous silicon including, for example, laser crystallization. Besides laser crystallization, other low temperature crystallization methods can be applied to the amorphous silicon 14 for silicon crystallization.

Referring to FIG. 2B, the crystallized silicon layer (i.e., a polysilicon layer) is patterned to from an island-shaped active layer 16. The polysilicon active layer 16 is divided into a first portion 16a and second portions 16b. The first portion 16a is located in the middle of the polysilicon active layer 16, and the second portions 16b are located on both right and left sides of the first portion 16a. The first portion 16a is often referred to as an active portion, and the second portions 16b are often referred to as ohmic contact portions. A gate insulation layer 18 is formed on the buffer layer 12 to cover the polysilicon active layer 16. The gate insulation layer 18 is made of silicon oxide ($SiO_2$) using a Plasma Enhanced Chemical Vapor Deposition (PECVD) method.

Referring to FIG. 2C, a gate electrode 20 is formed on the gate insulation layer 18 to define the active portion 16a. Thereafter, the gate insulation layer 18 is patterned into a gate-electrode shape, but this patterning process can be omitted so that the gate insulation layer 18 can remain on the buffer layer 12 while covering the polysilicon active layer 16. After forming the gate electrode 20 right above the active portion 16a, dopant ions, such as p-type ions, are doped into the second portions 16b. Since the gate electrode 20 is disposed above the first portion 16a and acts as an ion stopper, the dopant ions, such as p-type ions, are not doped into the first portion 16a. The doped areas, the second portions 16b, become highly-doped source/drain contact areas where source and drain electrodes are contacted in a later step.

Referring to FIG. 2D, an interlayer insulator 22 is formed over the entire substrate 10 to cover the gate electrode 20, the gate insulation layer 18 and the active layer 16. A first contact hole 24 and a second contact hole 26 are formed through the interlayer insulator 22, thereby exposing the second portions 16b (i.e., the highly-doped source/drain portions) of the polysilicon active layer 16, respectively. The exposed second portions 16b are source and drain regions on which source and drain electrodes are formed, respectively.

Referring to FIG. 2E, a source electrode 28 and a drain electrode 30 are formed on the interlayer insulator 22. The source and drain electrodes 28 and 30 electrically contact the exposed second portions 16b of the polysilicon active layer 16, respectively, through the respective first and second contact holes 24 and 26. This completes a top gate type thin film transistor having a low temperature polysilicon layer.

However, the method of forming the low temperature polysilicon thin film transistor includes some disadvantages. The gate insulation layer of silicon oxide is formed on the polysilicon active layer, and then the gate electrode is formed on the silicon oxide gate insulation layer. At this time, interface states are inevitably formed between the gate insulation layer and the polysilicon active layer. Furthermore, the operating characteristics of the LTPS-TFT may degrade due to the fact that the silicon oxide gate insulation layer has low resistance against F-N stress (Fowler-Nordheim stress).

FIG. 3 is a graph showing current characteristics of silicon oxide layer in accordance with gate voltage and gate current density applied to a metal of the Metal-Oxide-Semiconductor (MOS) structure. As shown in FIG. 3, as the gate voltage is applied to the metal of the MOS structure, the gate current density applied to the silicon oxide layer is divided into three different dominant regions; a leakage current dominant region (gate insulation layer quality dependent region), a F-N tunneling dominant region that is a peculiar current mechanism of silicon oxide, and a hard breakdown region where the silicon oxide layer loses its dielectric characteristic. The current passing through the silicon oxide layer is represented by summing up the leakage current value and the tunneling current value.

To test the reliability of the silicon oxide layer, the voltage and current level in the F-N tunneling dominant region is continuously applied to the silicon oxide layer such that an F-N stress is continuously applied to the silicon oxide layer. Thereafter, the point of time of breakdown is measured in the silicon oxide layer. For example, the constant current in the F-N tunneling dominant region is applied to the silicon oxide layer for a long time. The time of breakdown of the silicon oxide layer can be represented by current density×time to dielectric breakdown=charge to breakdown. As the value of charge to breakdown increases, so does the reliability of the silicon oxide layer. The LTPS-TFT fabricated through the related art of FIGS. 2A–2E has a silicon oxide layer 18 shows a very low resistance to F-N stress.

SUMMARY OF THE INVENTION

Accordingly, the present invention is directed to a method for fabricating a low temperature polysilicon thin film transistor (LTPS-TFT) that substantially obviates one or more of the problems due to limitations and disadvantages of the related art.

An advantage of the present invention is to provide a method for fabricating a polysilicon thin film transistor, which has an improved silicon oxide layer.

Another advantage of the present invention is to provide a method of fabricating a polysilicon thin film transistor, which increases the reliability of the silicon oxide layer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of forming a polysilicon thin film transistor that includes depositing an amorphous silicon layer over a substrate, crystallizing the amorphous silicon layer into a polycrystalline silicon layer, patterning the polycrystalline silicon layer to form a polysilicon active layer for a thin film transistor, depositing silicon oxide over the polysilicon active layer to form a gate insulation layer under a vacuum condition, applying heat to anneal the gate insulation layer under a vacuum condition and forming a gate electrode on the annealed gate insulation layer.

In another aspect, a method of forming a polysilicon thin film transistor includes forming a buffer layer over a substrate, depositing an amorphous silicon layer over the buffer layer, crystallizing the amorphous silicon layer into a polycrystalline silicon layer, patterning the polycrystalline silicon layer to form a polysilicon active layer, depositing silicon oxide over the polysilicon active layer to form a gate insulation layer under a vacuum condition, applying heat to anneal the gate insulation layer under a vacuum condition, forming a gate electrode on the annealed gate insulation layer, applying dopants to the polysilicon active layer to form source and drain regions, forming an interlayer insulator to cover the gate electrode, the gate insulation layer and the source and drain regions, forming source and drain contact holes in the interlayer insulator to expose portions of the source region and the drain region, respectively, and forming source and drain electrodes.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE ILLUSTRATED EMBODIMENTS

Reference will now be made in detail to the embodiments of the present invention, examples of which are illustrated in the accompanying drawings. Wherever possible, the similar reference numbers will be used throughout the drawings to refer to the same or like parts.

In exemplary embodiments of the present invention, the reliability of a silicon oxide ($SiO_x$) layer, which is formed by $SiH_4$-based plasma enhanced chemical vapor deposition (PECVD) and implemented in metal-oxide-semiconductor (MOS) capacitors, is improved. Additionally, the characteristics of a low temperature polysilicon thin film transistor (LTPS-TFT) are improved using a more reliable silicon oxide ($SiO_x$) layer. The improvement in the integrity of the silicon oxide ($SiO_x$) layer and device reliabilities using such an improved a silicon oxide ($SiO_x$) layer are achieved by applying an appropriate thermal treatment after silicon oxide deposition. Preferably, after a silicon oxide layer is deposited over a substrate, an annealing process is performed on the silicon oxide layer under a pressure of 500 mTorr at a temperature of less than 500 degrees Celsius.

For example, a MOS capacitor having a 100 nm-thick silicon oxide layer is formed on a p-type silicon wafer by using $SiH_4$-based PECVD. After the silicon oxide deposition, elevated-temperature post annealing without vacuum break is applied to the deposited silicon oxide and compared with as-deposited oxide. Silicon oxide integrity characteristics, such as flat band voltage ($V_{fb}$) shift by Fowler-Nordheim stress (FNS), charge to breakdown, and charge trapping under FNS, are measured and compared between the as-deposited and post annealed silicon oxide layers.

To evaluate the reliability of the silicon oxides implemented in a TFT, polysilicon TFT test devices with gate width W=8 micrometers (em) and gate length L=6 micrometers ($\mu$m) are fabricated with a CMOS process. A polysilicon layer is made from amorphous silicon (a-Si) precursor by excimer laser annealing. After defining the active area of polysilicon, the silicon oxides with the same split conditions described above are deposited and a gate electrode is formed. TFT device parameters, such as field effect mobility, transconductance, subthreshold swing, and threshold voltage ($V_{th}$), are also compared with respect to the reliability. The parameters of MOS and CMOS TFT devices are measured with a HP 4145 semiconductor parameter analyzer.

Figure 1:
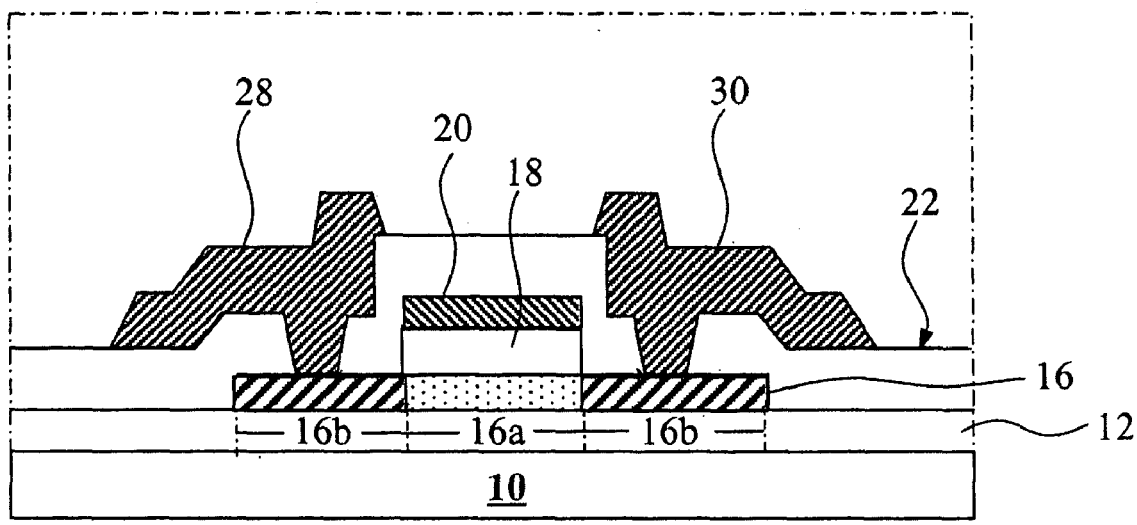
FIG. 1 is a cross-sectional view illustrating a low temperature polysilicon thin film transistor (LTPS-TFT) according to a related art.
Figure 2A:
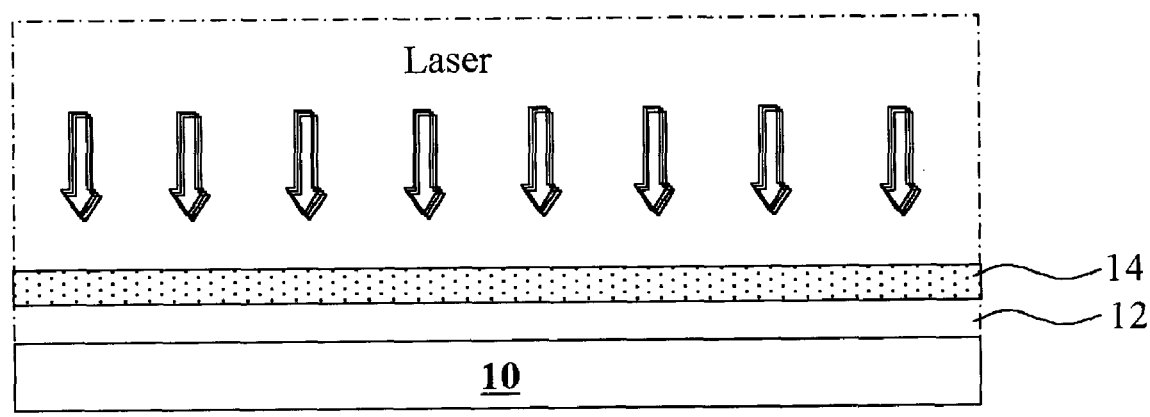
FIGS. 2A to 2E are cross-sectional views illustrating process steps of forming a low temperature polysilicon thin film transistor (LTPS-TFT) having a top gate according to the related art.
Figure 2B:
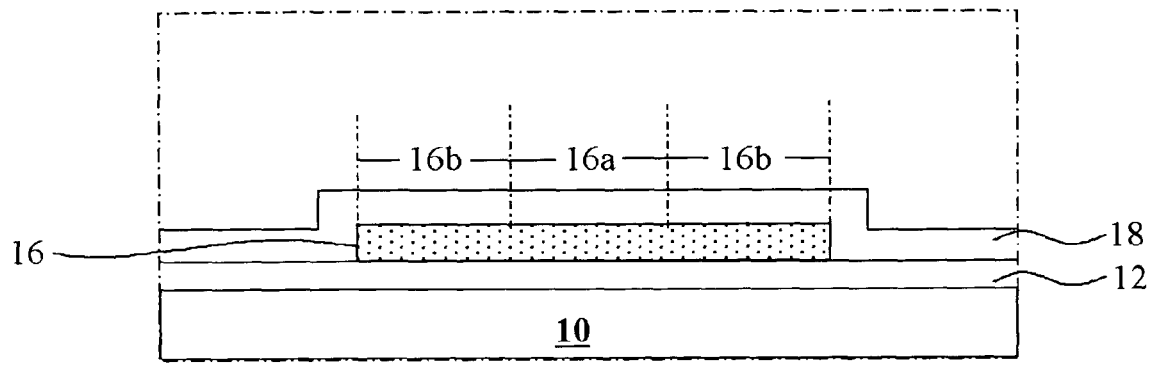
Figure 2C:
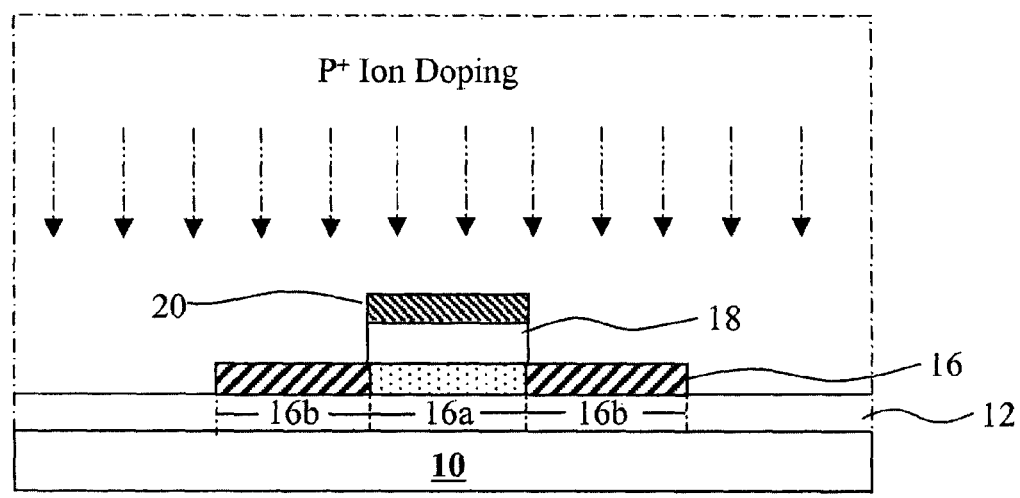
Figure 2D:
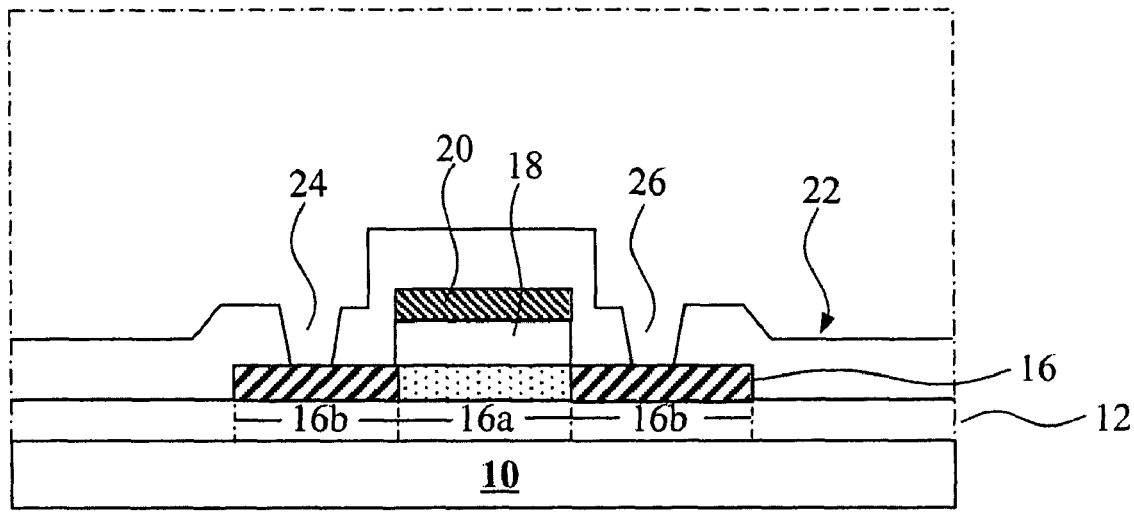
Figure 2E:
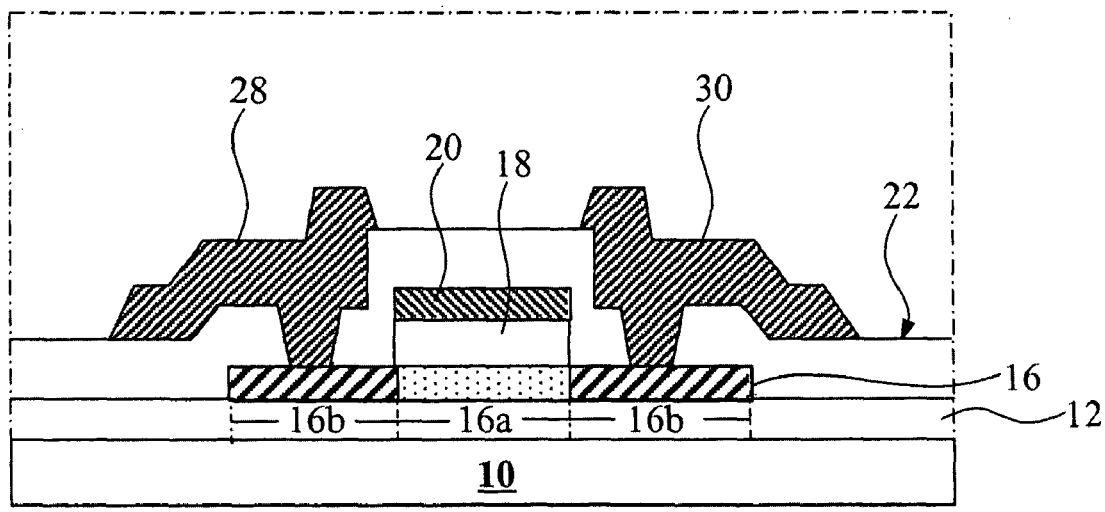
Figure 3:
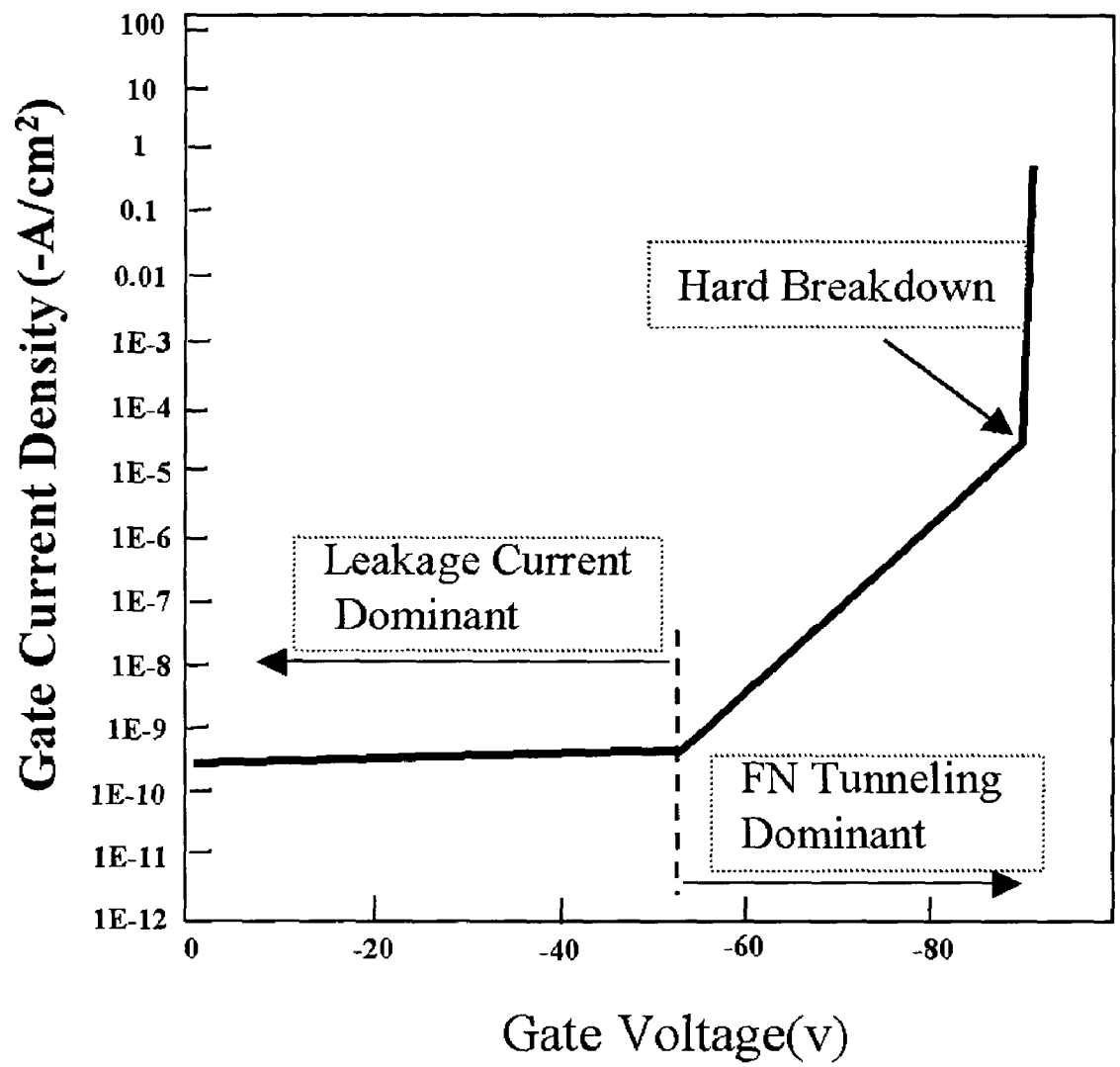
FIG. 3 is a graph showing current characteristics of silicon oxide layer in accordance with gate voltage and gate current density applied to a metal of the Metal-Oxide-Semiconductor (MOS) structure.
Figure 4:
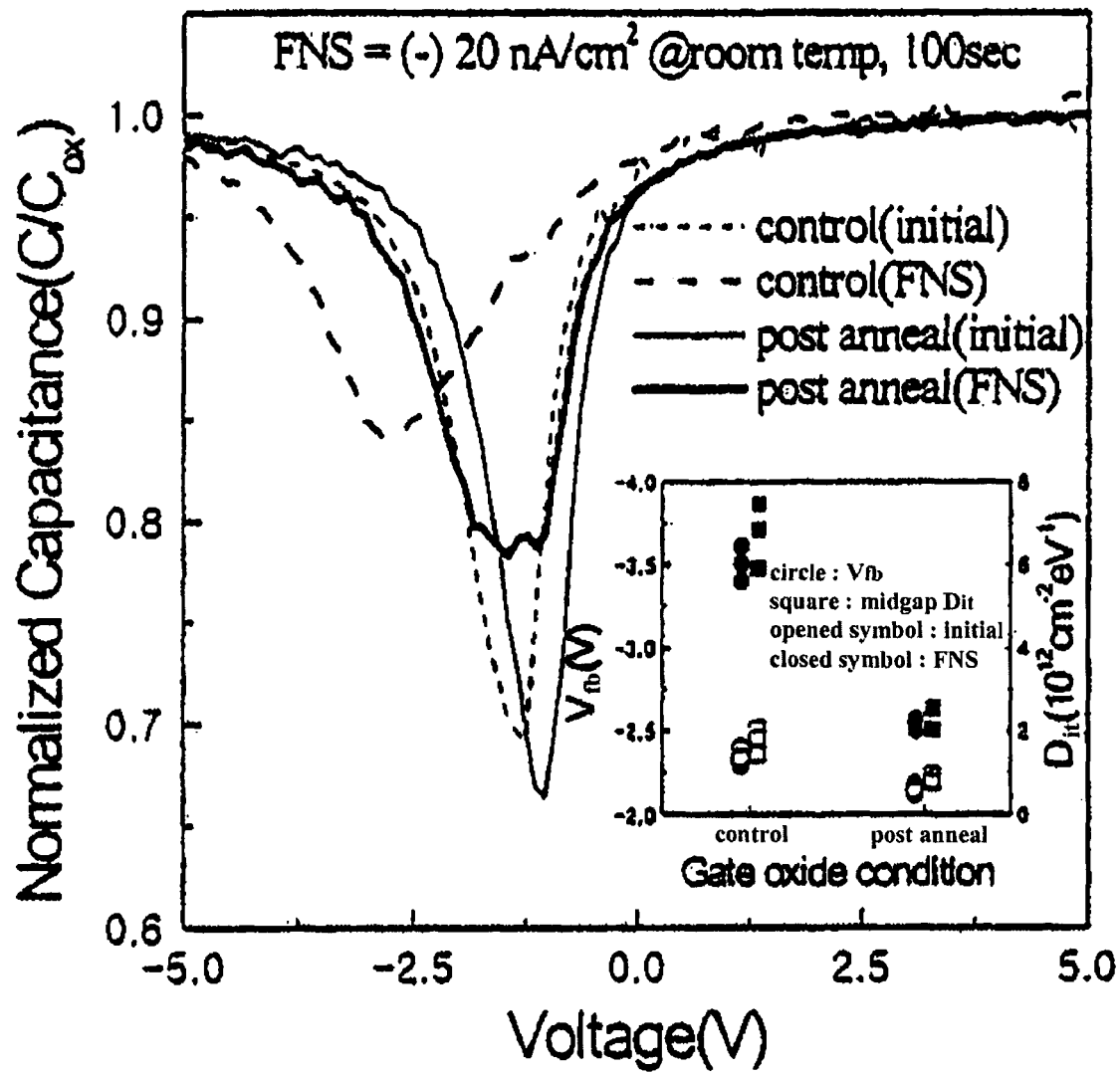
FIG. 4 is a graph showing the results of normalized quasi-static C-V (capacitance-voltage) plot.

MOS capacitance-voltage (C-V) characteristics are investigated before and after FNS. FIG. 4 shows the result of normalized quasi-static C-V plot. For the F-N stress, a constant current density of (−) 20 nA/cm2 is applied to the gate for about 100 seconds at room temperature. Applying constant current F-N stress, negative shift of C-V plot with severe distortion is observed for as-deposited silicon oxide. This shift results from hole trapping in the silicon oxide film supplied from the p-type silicon substrate. The negative shift of C-V plot and its distortion, however, is reduced for the post annealed silicon oxide. The inset in FIG. 4 shows a flat band voltage $V_{fb}$ and mid gap interface states density $D_{it}$ before and after the F-N stress. For the post annealed silicon oxide, both initial $V_{fb}$ and $D_{it}$ are reduced. By applying the F-N stress, the differences of both of $V_{fb}$ and $D_{it}$ between the as-deposited (or control) and post annealed silicon oxide are still more enhanced. This result means that the silicon oxide integrity reliability depends on mid gap $D_{it}$ generation under the F-N stress, which is improved by applying post anneal after silicon oxide deposition. In FIG. 4, it is possible to compare $V_{fb}$ and $D_{it}$ both of which represent the conditions of the as-deposited and post annealed silicon oxide ($SiO_x$). At the initial state of the first annealing, the flat band voltage $V_{fb}$ has a value of about −2.2 V [$V_{fb}$(V)□−2.2 V], and the mid gap interface states density $D_{it}$ has a value of 1×10$^{12}$/cm$^2$ eV [Dit(10$^{12}$/cm$^2$ eV)=1×10$^{12}$/cm$^2$ eV]. After FNS in the present invention, however, the flat band voltage $V_{fb}$ has a value of about −2.5 V [$V_{fb}$ (V)□−2.5 V], and the mid gap interface states density $D_{it}$ has a value of 2.3×10$^{12}$/cm$^2$ eV [Dit(10$^{12}$/cm$^2$ eV)=2.3×10$^{12}$/cm$^2$ eV]. As a result, the difference of flat band voltage ($\Delta V_{fb}$) between initial flat band voltage [$V_{fb}$(initial)υ and flat band voltage after Fowler-Nordheim stress [$V_{fb}$(FNS)] is only less than 0.5 V after applying the heat to anneal the gate insulation layer, i.e., [$V_{fb}$=$V_{fb}$(initial)−$V_{fb}$(FNS)]<0.5 V.

Figure 5:
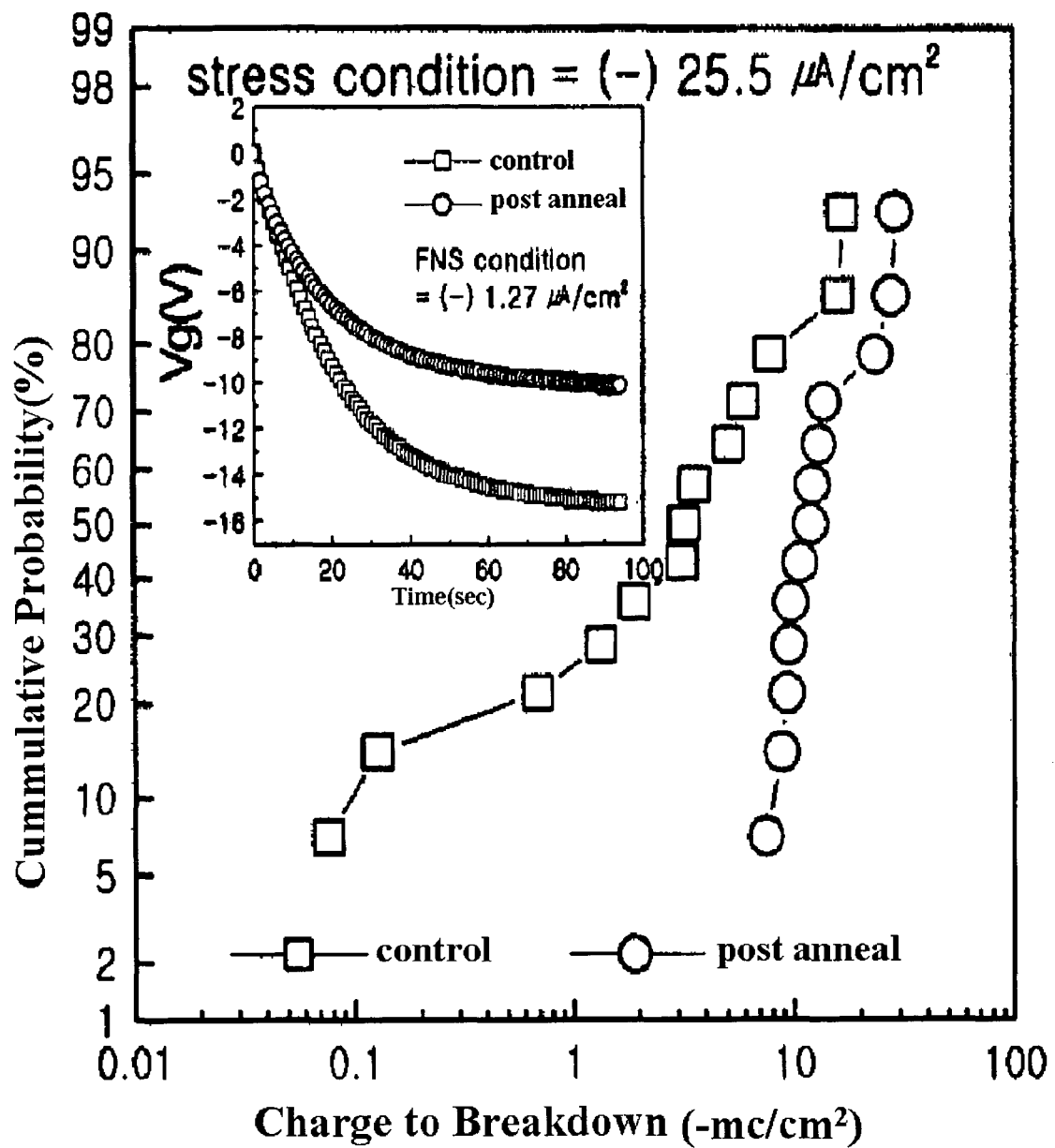
FIG. 5 is a graph showing $Q_{bd}$ (Charge to Breakdown) characteristics of as-deposited and post annealed silicon oxide under constant current F-N stress of (−) 25.5 $\mu A/cm^2$.

Charge to breakdown $Q_{bd}$ characteristics for the as-deposited and post annealed silicon oxide layers are investigated under the constant current F-N stress. FIG. 5 represents the charge to breakdown $Q_{bd}$ of the as-deposited and post annealed silicon oxides. The charge to breakdown $Q_{bd}$ of the post annealed silicon oxide is higher than that of as-deposited oxide, and so is the silicon oxide integrity. This can be understood from the charge trapping characteristics under constant current F-N stress by monitoring gate voltage variation. The inset represents the gate voltage variation to maintain a constant current stress of (−) 1.27 $\mu$A/cm$^2$. The gate voltage variation, due to charge trapping, as time elapses is severer for the as-deposited oxide compared with the post annealed silicon oxide. This explains the silicon oxide integrity dependence on charge trapping characteristics, and the silicon oxide integrity of the post annealed silicon oxide under the constant current F-N stress is drastically improved by reduced charge trapping.

In exemplary embodiments of the present invention, the characteristics of the silicon oxide film formed by $SiH_4$-based PECVD are studied for TFT application, and the silicon oxide integrity and its reliability are compared between the as-deposited and post annealed silicon oxides. By applying post anneal, obtained are the highly reliable silicon oxide (i.e., the higher charge to breakdown) and the less flat band voltage shift by the F-N stress, which can be explained by the reduction of charge trapping and less deep level interface states generation compared with the as-deposited case. Furthermore, obtained are more reliable CMOS characteristics explained by the increase of the F-N stress reliability and hot carrier stress immunity by applying elevated temperature post anneal after gate oxide deposition. These improvements of silicon oxide integrity, reliability, and CMOS performances give a solution for system-on-panel-integration of flat panel displays.

Figure 6A:
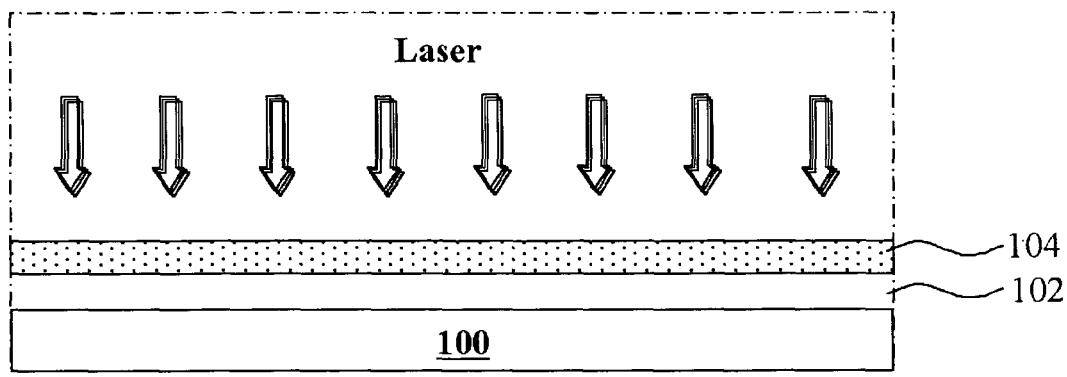
FIGS. 6A–6E are cross-sectional views illustrating process steps of forming a low temperature polysilicon thin film transistor (LTPS-TFT) having a top gate type according to the present invention.

FIGS. 6A–6E are cross-sectional views illustrating process steps of forming a low temperature polysilicon thin film transistor (LTPS-TFT) having a top gate according to an embodiment of the present invention. As shown in FIG. 6A, a buffer layer 102 is first deposited on a substrate 100. The buffer layer 102 is formed of one of silicon nitride and silicon oxide, for example. Here, the buffer layer 102 prevents alkali substances and the like in the substrate 100 from spreading into a later formed silicon layer. Thereafter, an amorphous silicon (a-Si:H) layer 104 is deposited on the buffer layer 102, and then crystallized. There are a lot of methods of crystallizing amorphous silicon including, for example, laser crystallization. Other than laser crystallization, other low temperature crystallization methods can be applied for the silicon crystallization.

Figure 6B:
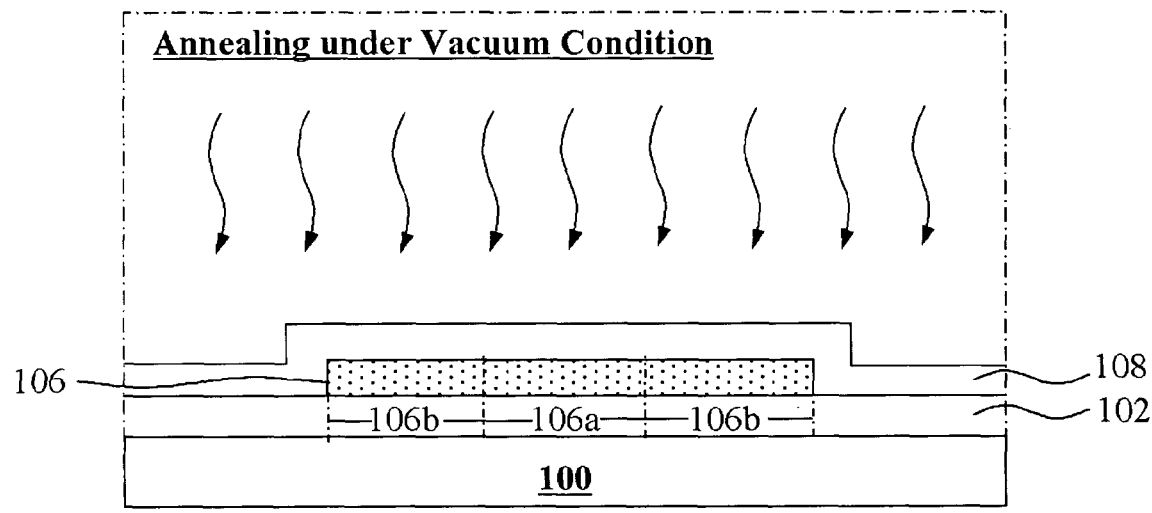

Referring to FIG. 6B, the crystallized silicon layer (i.e., a polysilicon layer) is patterned to form an island-shaped active layer 106. The polysilicon active layer 106 is divided into a first portion 106a and second portions 106b. The first portion 106a is located in the middle of the polysilicon active layer 106, and the second portions 106b are located on both right and left sides of the first portion 106a. The first portion 106a is often referred to as an active portion, and the second portions 106b are often referred to as ohmic contact portions. A gate insulation layer 108 is formed on the buffer layer 102 to cover the polysilicon active layer 106. The gate insulation layer 108 is made of silicon oxide ($SiO_2$) using a Plasma Enhanced Chemical Vapor Deposition (PECVD) method in a vacuum chamber for example.

When forming the silicon oxide gate insulation layer 108 using PEVCD, a vacuum chamber is utilized so that the silicon oxide is deposited over the substrate 100 under a vacuum condition. After the silicon oxide deposition, an annealing process is applied under a vacuum condition to the deposited silicon oxide layer 108 without breaking the vacuum created when the silicon oxide layer was formed. In the vacuum chamber, during the annealing process, the circumstance maintains under a pressure from 50 mTorr to 5000 mTorr, about 500 mTorr, for example. During the annealing, the heat is applied at 400 to 600 degrees Celsius, thereby performing the desired annealing process to the silicon oxide gate insulation layer 108. The atmosphere of the vacuum chamber can be partially or fully filled with $N_2$, $H_2$, $O_2$, $N_2O$ and/or NO during the annealing. If the above-mentioned annealing process is conducted under the $H_2$ atmosphere, the resulting silicon oxide gate insulation layer 108 can become highly dense. The annealing temperature should be generally higher than the deposition temperature of silicon oxide. Although it is said the annealing process above is conducted under the vacuum circumstance, it is possible to performing the annealing process under a non-vacuum condition.

Figure 6C:
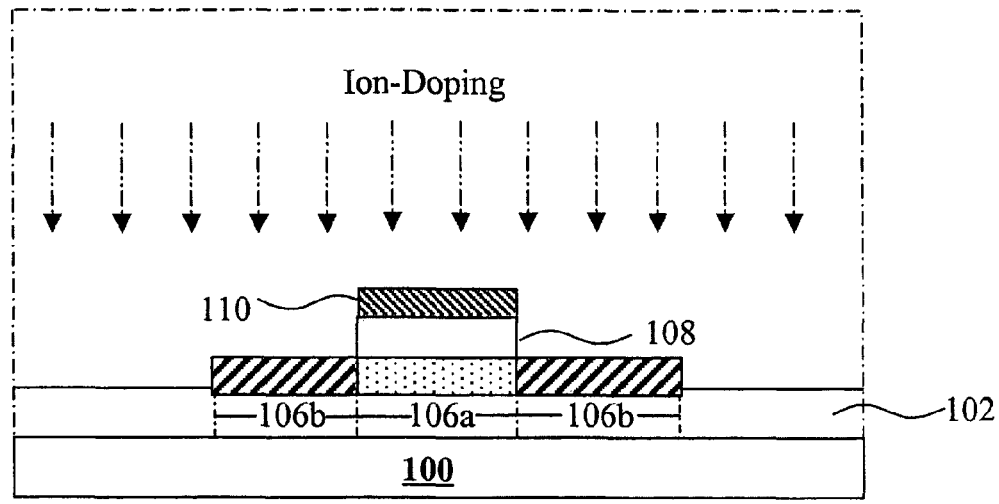

Referring to FIG. 6C, a gate electrode 110 is formed on the gate insulation layer 108 to define the active portion 106a. Thereafter, the gate insulation layer 108 is patterned into a gate-electrode shape, but this patterning process can be omitted so that the gate insulation layer 108 can remain on the buffer layer 102 while covering the polysilicon active layer 106. After forming the gate electrode 110 right above the active portion 106a, p-type ions (e.g. boron ions) are doped onto the second portions 106b. Instead of the p-type ions, n-type ions (e.g., phosphorous ions) can be applied to the second portions 106b. Since the gate electrode 110 is disposed above the first portion 106a and acts as an ion stopper, the dopants, such as p-type ions, are not doped into the first portion 106a. The doped areas, the second portions 106b, become highly-doped source/drain contact areas where source and drain electrodes contact in a later step.

Figure 6D:
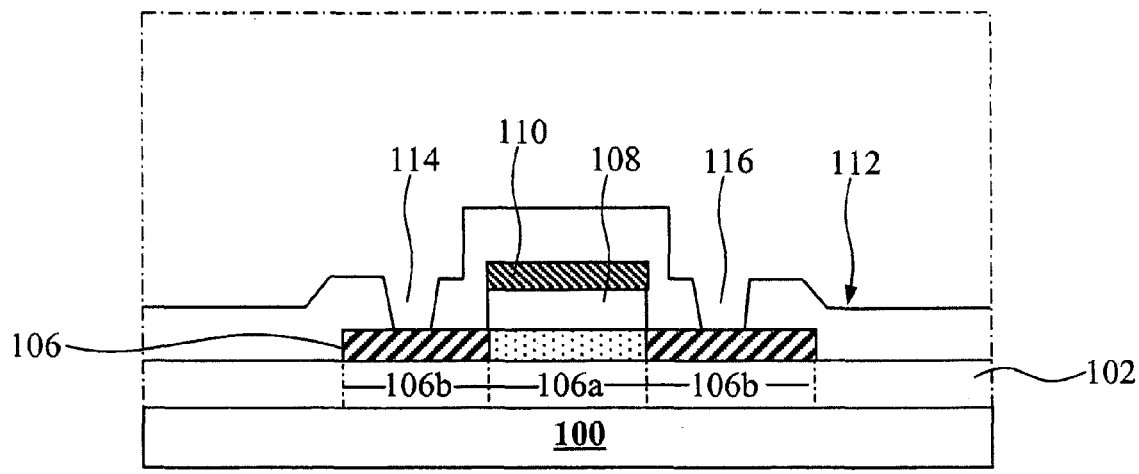

Referring to FIG. 6D, an interlayer insulator 112 is formed over the entire substrate 100 so as to cover the gate electrode 110, the gate insulation layer 108 and the active layer 106. A first contact hole 114 and a second contact hole 116 are formed through the interlayer insulator 112, thereby exposing the second portions 106b (i.e., the highly-doped source/drain portions) of the polysilicon active layer 106, respectively. The exposed second portions 106b are source and drain regions on which source and drain electrodes are formed, respectively.

Figure 6E:
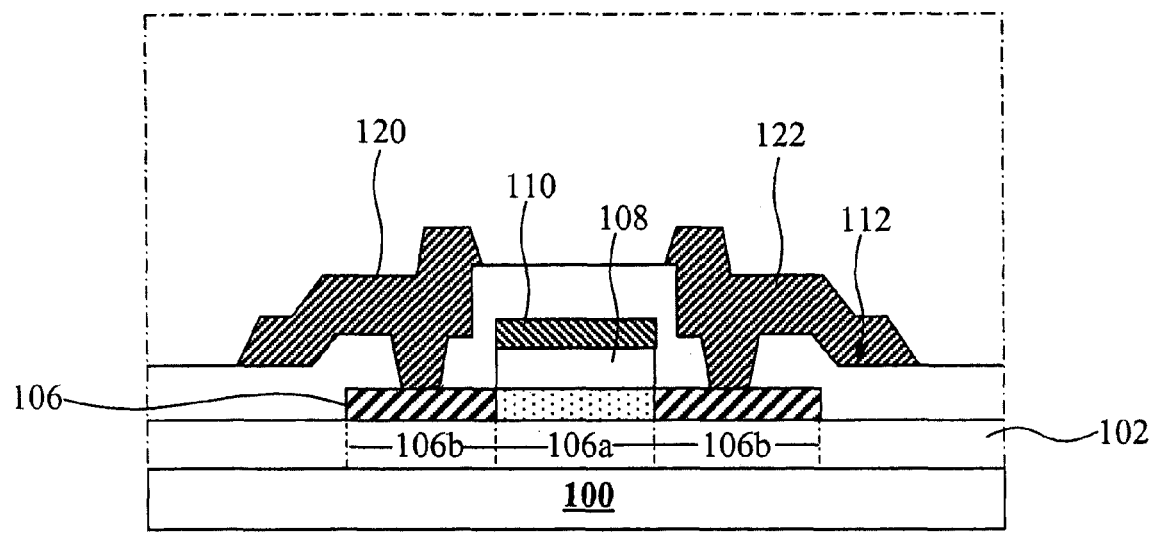

Referring to FIG. 6E, a source electrode 120 and a drain electrode 122 are formed on the interlayer insulator 112. The source and drain electrodes 120 and 122 electrically contact the exposed second portions 106b of the polysilicon active layer 106, respectively, through the respective first and second contact holes 114 and 116. This completes a top gate type thin film transistor having the low temperature polysilicon layer and the improved gate insulation layer according to this embodiment of the present invention.

According to the inventive method of forming the low temperature polysilicon thin film transistor, the gate insulation layer is formed in high density and with improved reliability, which leads to reduction of interface trap density at an interface between the polysilicon active layer and the gate insulation layer. Furthermore, the operating characteristics of the LTPS-TFT can be greatly reliable, and the resistibility against F-N stress (Fowler-Nordheim stress) can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of forming a polysilicon thin film transistor, comprising:
    depositing an amorphous silicon layer over a substrate;
    crystallizing the amorphous silicon layer into a polycrystalline silicon layer;
    patterning the polycrystalline silicon layer to form a polysilicon active layer for a thin film transistor;
    depositing silicon oxide over the polysilicon active layer to form a gate insulation layer under a vacuum condition;
    applying heat to anneal the gate insulation layer under the vacuum condition, wherein there is no vacuum break between depositing silicon oxide to form the gate insulation layer and applying heat to anneal the gate insulation layer and wherein the applying heat to anneal the gate insulation layer is conducted under atmosphere including at least $H_2$; and
    forming a gate electrode on the annealed gate insulation layer.

2. The method of claim 1, wherein applying the heat to anneal the gate insulation layer is performed at a temperature ranging from 400 to 600 degrees Celsius.

3. The method of claim 1, wherein the vacuum condition for applying the heat to anneal the gate insulation layer is a pressure ranging from 50 to 5000 mTorr.

4. The method of claim 1, wherein depositing silicon oxide includes using a plasma enhanced chemical vapor deposition (PECVD) method.

5. The method of claim 1, wherein crystallizing the amorphous silicon layer includes applying heat to the amorphous silicon layer using an excimer laser.

6. The method of claim 1, wherein applying heat occurs in atmosphere of a vacuum chamber that also includes at least one of $N_2$, $O_2$, $N_2O$ and NO.

7. A method of forming a polysilicon thin film transistor, comprising:
    depositing an amorphous silicon layer over a substrate;
    crystallizing the amorphous silicon layer into a polycrystalline silicon layer;
    patterning the polycrystalline silicon layer to form a polysilicon active layer for a thin film transistor;
    depositing silicon oxide over the polysilicon active layer to form a gate insulation layer under a vacuum condition;
    applying heat to anneal the gate insulation layer under the vacuum condition; and
    forming a gate electrode on the annealed gate insulation layer, wherein the difference of flat band voltage ($\Delta V_{fb}$)

between initial flat band voltage [$V_{fb}$(initial)] and flat band voltage after Fowler-Nordheim stress [$V_{fb}$(FNS)] is less than 0.5 V after applying the heat to anneal the gate insulation layer.

8. The method of claim 1, wherein the temperature of annealing the gate insulation layer is higher than the temperature of depositing the silicon oxide.

9. A method of forming a polysilicon thin film transistor, comprising:
   forming a buffer layer over a substrate;
   depositing an amorphous silicon layer over the buffer layer;
   crystallizing the amorphous silicon layer into a polycrystalline silicon layer;
   patterning the polycrystalline silicon layer to form a polysilicon active layer;
   depositing silicon oxide over the polysilicon active layer to form a gate insulation layer under a vacuum condition;
   applying heat to anneal the gate insulation layer under the vacuum condition, wherein there is no vacuum break between depositing silicon oxide to form the gate insulation layer and applying heat to anneal the gate insulation layer and wherein the applying heat to anneal the gate insulation layer is conducted under atmosphere including at least $H_2$;
   forming a gate electrode on the annealed gate insulation layer;
   applying dopants to the polysilicon active layer to form source and drain regions;
   forming an interlayer insulator to cover the gate electrode, the gate insulation layer and the source and drain regions;
   forming source and drain contact holes in the interlayer insulator to expose portions of the source region and the drain region, respectively; and
   forming source and drain electrodes.

10. The method of claim 9, wherein applying the heat to anneal the gate insulation layer is performed at a temperature ranging from 400 to 600 degrees Celsius.

11. The method of claim 9, wherein the vacuum condition for applying the heat to anneal the gate insulation layer is a pressure ranging from 50 to 5000 mTorr.

12. The method of claim 9, wherein the gate insulation layer is formed by using a plasma enhanced chemical vapor deposition (PECVD) method.

13. The method of claim 9, wherein crystallizing the amorphous silicon layer includes applying heat to the amorphous silicon layer using an excimer laser.

14. The method of claim 9, wherein the buffer layer includes at least one of silicon oxide ($SiO_x$) and silicon nitride ($SiN_x$).

15. The method of claim 9, wherein applying dopants includes applying p-type ions.

16. The method of claim 15, wherein the p-type ions are boron ions.

17. The method of claim 9, wherein applying dopants includes applying n-type ions.

18. The method of claim 17, wherein the n-type ions are phosphorous ions.

19. The method of claim 9, wherein applying heat occurs in atmosphere of a vacuum chamber that also includes at least one of $N_2$, $O_2$, $N_2O$ and NO.

20. The method of claim 9, wherein the temperature of annealing the gate insulation layer is higher than the temperature of depositing the silicon oxide.

21. A method of forming a polysilicon thin film transistor, comprising:
   forming a buffer layer over a substrate;
   depositing an amorphous silicon layer over the buffer layer;
   crystallizing the amorphous silicon layer into a polycrystalline silicon layer;
   patterning the polycrystalline silicon layer to form a polysilicon active layer;
   depositing silicon oxide over the polysilicon active layer to form a gate insulation layer under a vacuum condition;
   applying heat to anneal the gate insulation layer under the vacuum condition;
   forming a gate electrode on the annealed gate insulation layer;
   applying dopants to the polysilicon active layer to form source and drain regions;
   forming an interlayer insulator to cover the gate electrode, the gate insulation layer and the source and drain regions;
   forming source and drain contact holes in the interlayer insulator to expose portions of the source region and the drain region, respectively; and
   forming source and drain electrodes, wherein the difference of flat band voltage ($\Delta V_{fb}$) between initial flat band voltage [$V_{fb}$(initial)] and flat band voltage after Fowler-Nordheim stress [$V_{fb}$(FNS)] is less than 0.5 V after applying the heat to anneal the gate insulation layer.

22. A method of forming a polysilicon thin film transistor, comprising:
   depositing an amorphous silicon layer over a substrate;
   crystallizing the amorphous silicon layer into a polycrystalline silicon layer;
   patterning the polycrystalline silicon layer to form a polysilicon active layer for a thin film transistor;
   depositing silicon oxide over the polysilicon active layer to form a gate insulation layer under a vacuum condition;
   applying heat to anneal the gate insulation layer under a vacuum condition; and
   forming a gate electrode on the annealed gate insulation layer, wherein the difference of flat band voltage ($\Delta V_{fb}$) between initial flat band voltage [$V_{fb}$(initial)] and flat band voltage after Fowler-Nordheim stress [$V_{fb}$(FNS)] is less than 0.5 V after applying the heat to anneal the gate insulation layer.

* * * * *